United States Patent [19]

Elsayed-Ali

[11] Patent Number: 5,010,250
[45] Date of Patent: Apr. 23, 1991

[54] SYSTEM FOR SURFACE TEMPERATURE MEASUREMENT WITH PICOSECOND TIME RESOLUTION

[75] Inventor: Hani E. Elsayed-Ali, Rochester, N.Y.

[73] Assignee: The University of Rochester, Rochester, N.Y.

[21] Appl. No.: 462,376

[22] Filed: Jan. 9, 1990

[51] Int. Cl.$^5$ .............................................. H01J 37/295
[52] U.S. Cl. ...................................... 250/310; 374/43; 374/44; 374/102
[58] Field of Search ........................ 250/310, 306, 307; 374/43, 44, 102

[56] References Cited

U.S. PATENT DOCUMENTS

| 4,446,425 | 5/1984 | Valdmanis et al. | 324/77 K |
| 4,618,819 | 10/1986 | Mourou | 324/77 K |

FOREIGN PATENT DOCUMENTS

| 61-151449 | 7/1986 | Japan | 250/310 |
| 1323930 | 7/1987 | U.S.S.R. | 250/305 |

OTHER PUBLICATIONS

Wendelken et al., Review of Scientific Instruments, vol. 47, No. 9, Sept. 1976, pp. 1064–1078.
C. V. Shank, Yen & Hirlimann, Femto-Time-Resolved Surface Structural Dynamics of Optically Excited Silicon, *Physical Review Letters*, vol. 51, No. 10, Sept. 5, 1983, p. 900.
J. M. Hicks et al., Can Pulse Laser Excitation of Surfaces Be Described by a Thermal Model, *Physical Review Letters*, vol. 61, No. 22, Nov. 28, 1988, p. 2588.
*Solid State Physics*, Charles Kittel, 5th El., John Wiley & Sons, 1976, p. 63.

Primary Examiner—Jack I. Berman
Attorney, Agent, or Firm—Martin Lukacher

[57] ABSTRACT

A system for measuring the thermal characteristic of the surface-lattice of solid state materials with picosecond time resolution uses a picosecond laser pulse which is synchronized with a picosecond electron pulse; the electron pulse being generated by splitting the laser pulse into two beams one of which interacts with the surface under test and the second activates the cathode of an electron gun creating an electron pulse which is, collimated, focused and incident at a small acute angle (1–3 degrees) on the surface. The electron pulse generates a reflection high energy electron diffraction pattern (RHEED) which provides information on the surface temperature in accordance with the Debye-Waller effect. Time resolved measurements are made by using electron pulses which are delayed with respect to the laser pulses by successively greater time intervals.

13 Claims, 3 Drawing Sheets

SYSTEM FOR SURFACE TEMPERATURE MEASUREMENT WITH PICOSECOND TIME RESOLUTION

The United States Government has rights in this invention by virtue of contracts between agencies of the United States Government and The University of Rochester.

DESCRIPTION

The present invention relates to a measurement system for obtaining information as to the thermal characteristics, as of the surface of solid state materials. More particularly, the invention provides a system for measuring the change in surface (up to a few monolayers) temperature with time after a short (delta) heating pulse is applied to the surface (i.e.. the time evolution of the surface temperature).

The invention is especially suitable for making surface temperature measurements of thin surface layers (films) in situ and may be used in the design and manufacture of integrated circuits and other devices utilizing thin films. The invention, however, is generally applicable in making surface-lattice temperature measurements of solid state materials, whether in thin film or bulk form.

Other techniques for measuring the thermal characteristics of materials involves pulsed heating and probing the time evaluation of the temperature. For films of several hundred angstroms in thickness, optical techniques (as in pyrometry and reflectivity) have previously been utilized. However, these techniques are limited to film thickness greater than the penetration depth of the optical probe which is for the most absorbing materials, as in metals, is a few hundred angstroms and could be much larger for other materials. Therefore, these techniques are not suitable to measure the thermal properties of surfaces and films thinner than the penetration depth of the optical probe. These films are common in many industries including the manufacture of integrated circuits; and a system for measurement of the thermal characteristics of the surfaces thereof are still needed.

Accordingly, efforts have been directed at using laser pulses and surface sensitive (several monolayers distance between lattice atoms—usually a few angstroms) measurement techniques such as second harmonic laser light generation at the surface. for surface structural probes—C.V. Shank, R. Yen and C. Hirlimann, Femto-Time-Resolved Surface Structural Dynamics of Optically Excited Silicon, Physical Review Letters, Vol. 51, No. 10, 5 Sept., 1983, page 900, and for temperature probes. J.M. Hicks, et al., Can Pulse Laser Excitation of Surfaces Be Described By a Thermal Model, Physical Review Letters, Vol. 61, No. 22, 28 Nov., 1988, page 2588. Such techniques are indirect and are operative only with materials which are capable of second harmonic generation, such as silver. Practical applications require temperature measurements of materials, such as cobalt and titanium and other materials, especially all those which are used in integrated circuit manufacture.

It has been discovered in accordance with the invention that reflection high energy electron diffraction (RHEED) may be used as a lattice-surface temperature probe to provide surface temperature measurements with picosecond time resolution. Picosecond time resolution of temperature is obtained since heating (laser) pulses and electron pulses are short (picosecond range as exemplified below). The heating pulses enable dynamic conditions to be generated in the surface lattice while measurements are being made. The sensitivity of the diffraction pattern to temperature results from increased amplitude of atomic vibration in the surface atoms as temperature is raised. In other words, temperature increases the dephasing of the atomic scattering centers. The effect of this dephasing on the diffraction pattern is to reduce the number of electrons elastically scattered, and therefore the intensity of the RHEED pattern. The reduced intensity is manifested as increased background noise due to inelastically scattered electrons. Such a reduction in intensity occurs without widening of the diffraction spots. This effect is known as the Debye-Waller effect. It is described for x-ray diffraction patterns, in the text, Solid State Physics, by Charles Kittel, 5th Ed., John Wiley & Sons, 1976, page 63.

Making measurements of electrical signals propagating along a line adjacent to an electro optic crystal, on which a picosecond or subpicosecond laser beam is incident, by relatively delaying the optical beam with respect to the launching time of the signals through the line has been suggested. See Valdmanis & Mourou, U.S. Pat. Nos. 4,446,425, issued May, 1984 and 4,618,819, issued October, 1986.

It is the principal object of this invention to provide an improved system for measuring thermal characteristics of the surface-lattice (up to a few monolayers thickness) of solid state materials, whether thin films and bulk materials, by utilizing picosecond laser pulses synchronous with electron pulses and making measurements based upon the intensity of the reflection electron diffraction pattern from the surface, thereby combining uniquely both laser pulse and surface electron diffraction effects to make surface temperature measurements in situ with picosecond time resolution.

Briefly described, a system for measuring the thermal characteristics of the surface-lattice of a solid state material utilizes means for generating successive pairs of laser pulses and electron pulses which are synchronous with each other and are separated by successively greater periods of time which pulses are incident on the surface of the material under test. There may be used groups of repetitive pairs with like time delay; successive ones of the groups having successively longer time delays. Means are provided for detecting the diffraction patterns produced by the electrons upon reflection from the surface. Means are provided which are responsive to the patterns for obtaining the thermal characteristics of the surface-lattice in accordance with the changes in intensity of the patterns. The changes in the peak amplitude of the spatial diffraction (RHEED) patterns, i.e., the changes in RHEED streak intensity may be used to measure the changes in intensity.

The foregoing and other objects, features and advantages of the invention, as well as a presently preferred embodiment thereof will become more apparent from a reading of the following description in connection with the accompanying drawings in which.

Figure 3:
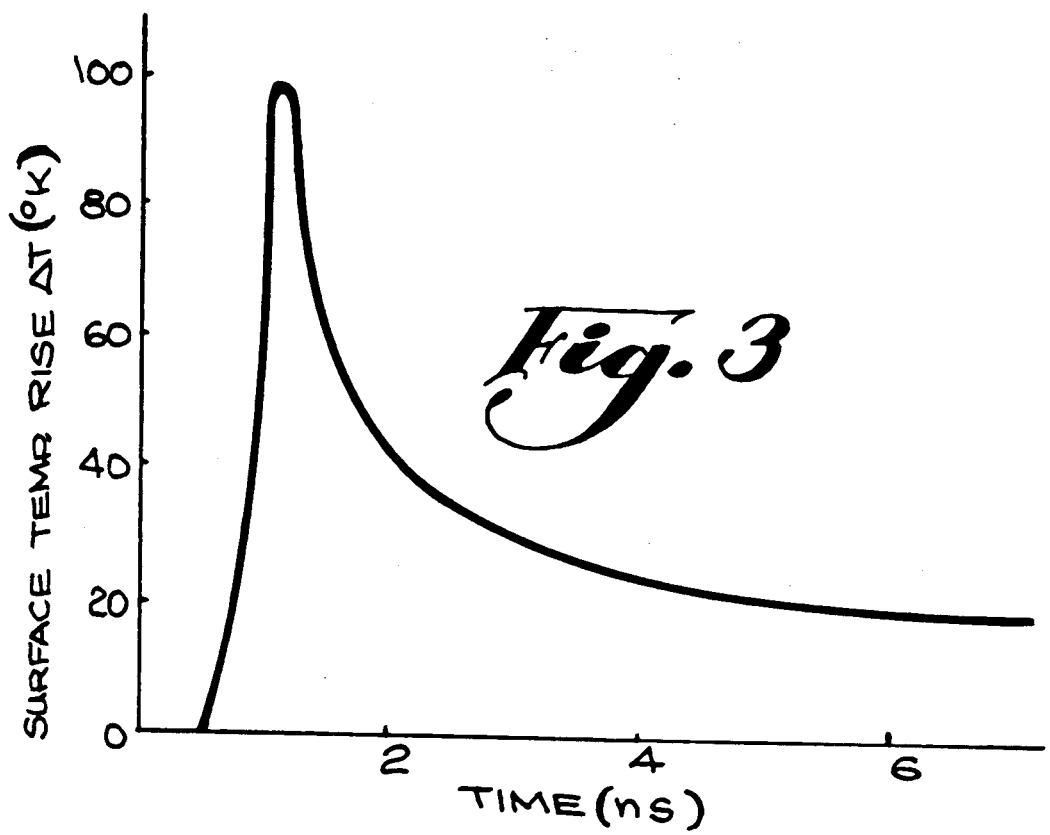
Figure 4:
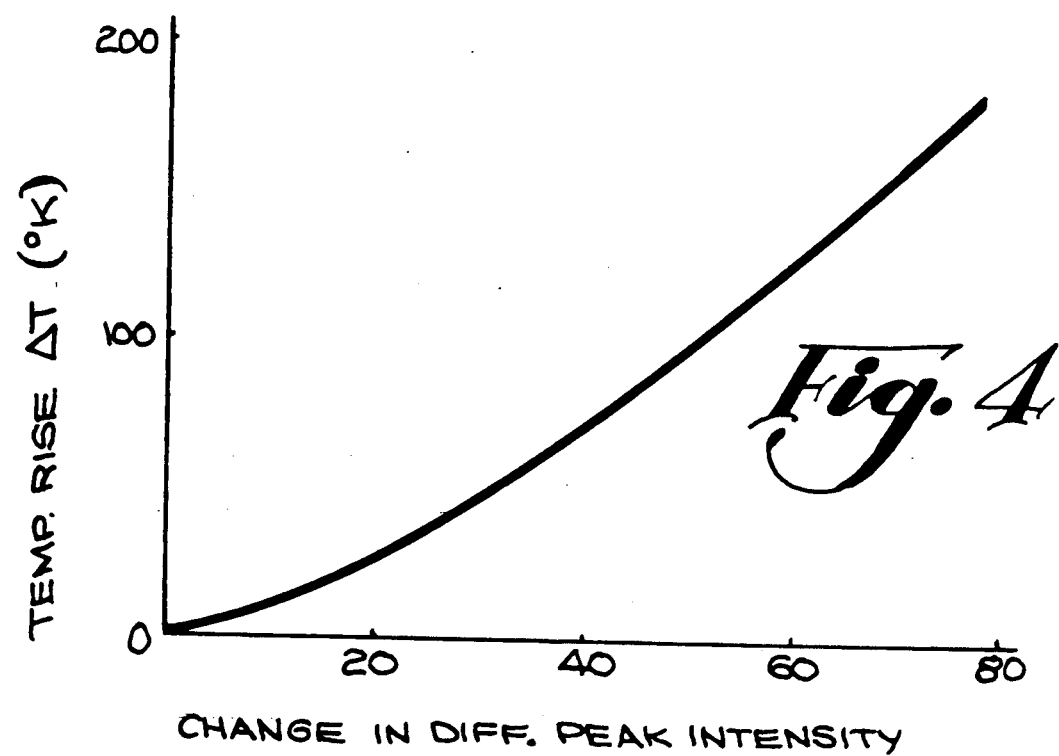

FIG. 3 is a curve showing the surface temperature rise with time (the time evolution of the surface temperature) which reveals that picosecond time resolution is obtained with the system described in connection with FIG. 1; and FIG. 4 is a calibration curve of diffraction peak intensity change with temperature rise which is obtained on a static or CW basis and is used to generate the temperature characteristic shown in FIG. 3.

Figure 1:
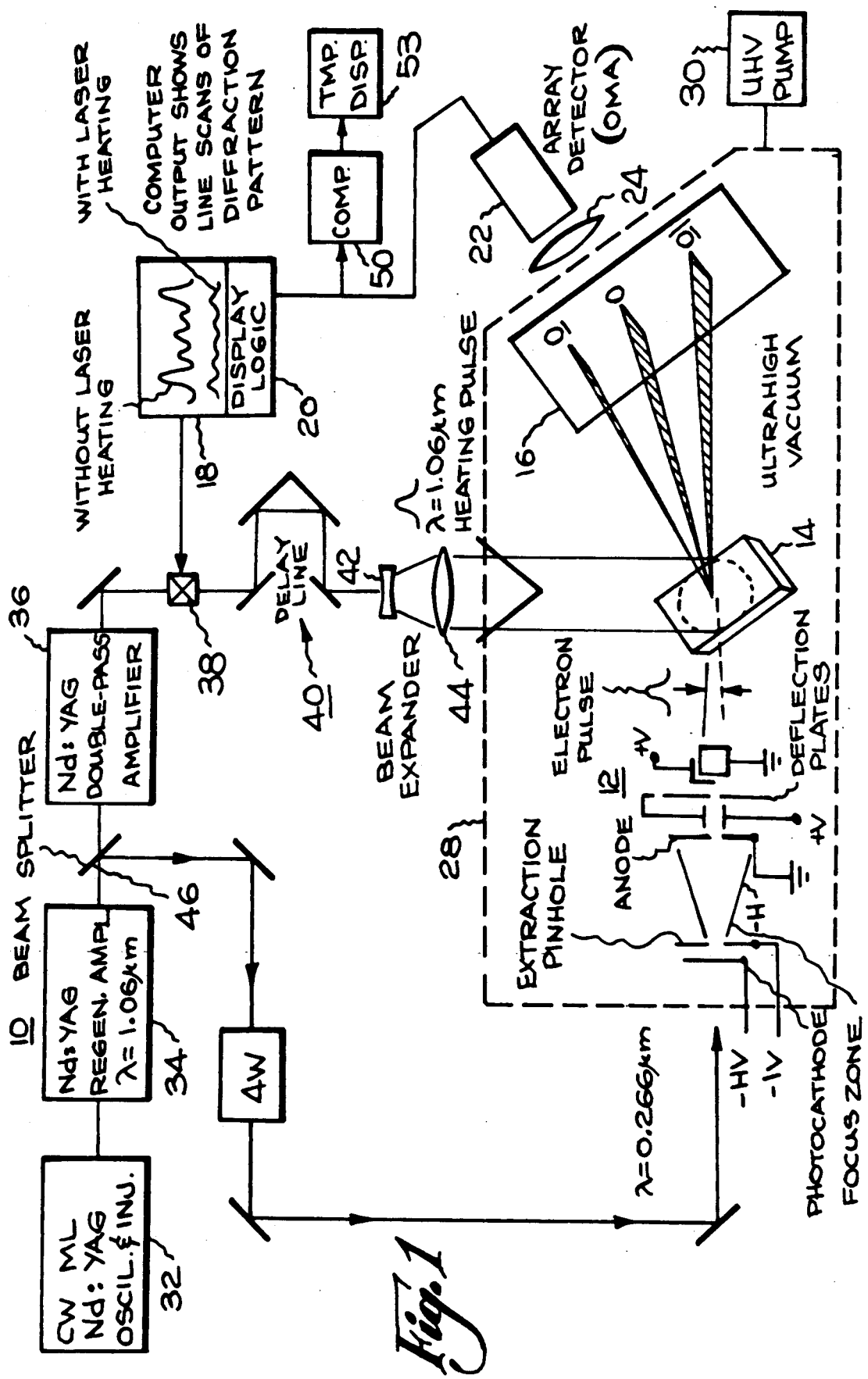
FIG. 1 is a schematic diagram of a system for surface temperature measurement with picosecond time resolution, which is provided in accordance with the invention.

Referring more particularly to FIG. 1 of the drawings, a laser system 10 produces picosecond laser pulses. A photo-activated electron gun 12 generates picosecond electron pulses synchronous with the laser pulses. The laser pulses, and electron pulses respectively illuminate and produce an electron diffraction pattern from the surface-lattice of material under test. This material is shown as a solid state body 14. Solid state bodies, such as crystal or thin films on substrates, such as layers used in integrated circuits, may have their surface-lattice temperatures probed by the system shown in FIG. 1.

The laser pulse illuminates the area of the surface of interest and is shown illuminating an area which covers substantially all of the surface of the body 14. It is a picosecond range (150-300 picosecond duration or width) laser pulse. Such short pulses are often referred to as a delta heating source. They cause a rapid rise in the temperature of the surface because the energy of the laser pulse is coupled to the surface. The laser pulse is in a collimated beam which is perpendicular to the surface in the exemplary system illustrated in FIG. 1. By picosecond electron pulse means a pulse having a duration (pulse width) of from 100-300 picoseconds. The electron pulse is focused by the gun 12 to a micron range (e.g. approximately 340 microns diameter) spot on the surface of the body 14. The pulse is incident at a small acute angle shown in the drawing as "a", which may be from 1 to 3 degrees.

The electron diffraction pattern is shown being created on a phosphor screen located immediately behind microchannel plates which act as an electron intensity amplifier. Such microchannel plates focus the electron pattern on the phosphor screen because of their proximity. Microchannel/phosphor screens are commercially available.

Figure 2:
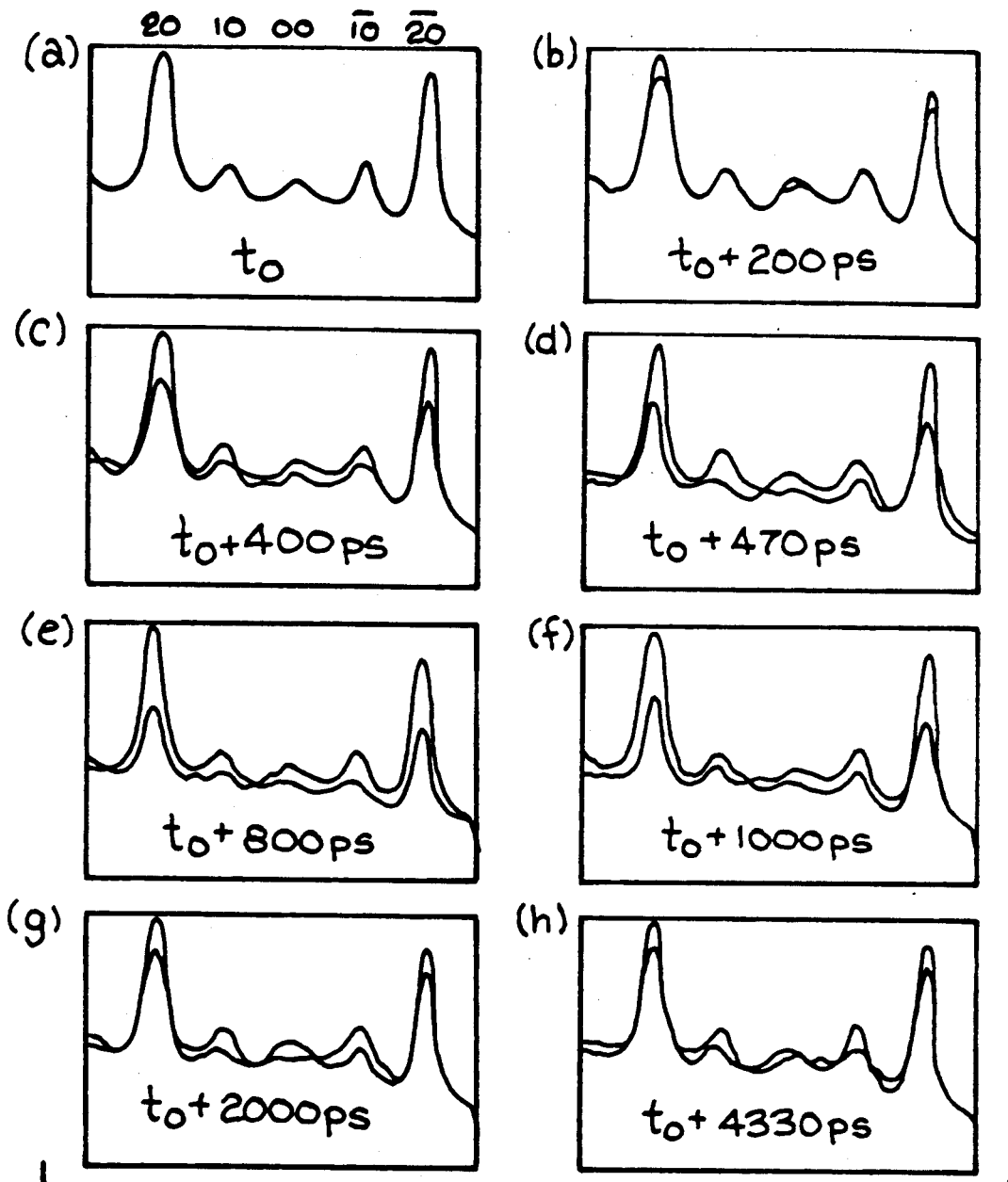
FIG. 2 is a series of curves of signals corresponding to the spatial diffraction patterns produced by many different pairs of successively spaced picosecond laser and electron pulses.

The designations 01, 00 and 0$\bar{1}$ show the location of the diffraction streaks. Only three locations are shown. When viewed from the rear of the microchannel plates - phosphor screen 16, these locations correspond to positions on a spatial intensity display of the diffraction pattern which is shown in FIG. 2.

A display 18 which may have display logic, such as a dedicated microprocessor (computer) 20 receives signals from an optical multichannel analyzer (OMA) 22. The diffraction pattern from the microchannel plates/phosphorus screen is focused by a lens 24 on the linear array detector of the OMA, suitably a 512 element detector. The linear array may be a line of detectors. Such OMA's with linear array detectors are commercially available. Thus, the OMA observes a line across the diffraction pattern.

The electron gun 12, the crystal and the microchannel plates/phosphor screen 16 are all in ultrahigh vacuum by being located in a chamber 28 with ports (windows) for the admission of the laser pulses and the extraction of the diffraction pattern. This chamber 28 is evacuated by an ultra high vacuum (UHV) pump 30 to a vacuum pressure of, e.g., $10^{-10}$ Torr.

The laser system 10 uses a CW pumped mode locked CW ML Nd:YAG (wavelength 1.06 micron) laser oscillator and injector 32 which seeds a variable repetition rate Nd:YAG regenerative amplifier 34. The injection system may be a Pockels cell and two polarizers to select the seeding pulses at the repetition rate. The oscillator 32 and regenerative amplifier 34 may be as described in Williamson et al., U.S. Pat. application, Ser. No. 06/618,274, filed June 7, 1984 and assigned to the same assignee as this application, now U.S. Pat. No. 4,896,119. The system is also described in the following publications: I.N. Duling, et al., Journal of the Optical Society of America, Vol. B-2, 616 (1985) and P. Bado, et al., Review of Scientific Instruments, Vol. 56, 1,744 (1985). The laser pulses from the regenerative amplifier may be passed through a spatial filter (not shown) and amplified in an Nd:YAG double pass laser amplifier 36. This amplifier in the exemplary system, provides output Pulses of 30 mJ and may be operated at an 8 Hz repetition rate.

The laser pulses are applied through a shutter 38 which can be controlled by the computer 20. As noted above the computer 20, is used in data acquisition from the OMA 22 to provide the spatial diffraction pattern intensity signal shown on the display 18.

In an exemplary system, every other laser heating pulse is blocked by the shutter 38. Therefore, two line scans are obtained from diffraction patterns; first without laser heating and second with laser heating. Data from each scan is stored in memory in the acquisition computer 20.

An optical delay line 40 varies the interval between the laser heating pulse and the electron probing pulse. The delays between each pulse pair or groups of pulse pairs (since several pulse pairs may be used with like spacing in time to enhance the intensity of the diffraction pattern) may vary between hundreds or thousands of picoseconds as will be described hereinafter in connection with FIG. 2. In other words, there is a heating pulse followed by an electron pulse in each pair, and groups of repetitive heating and electron pulses of like time spacing may be used to enhance the intensity of the diffraction pattern on the microchannel/phosphor screen 16.

The heating laser pulses are focused into a collimated beam by a lens system consisting of an expansion lens 42 and a collimating lens 44. The average laser heating pulse, in an exemplary system, had an energy of 15 to 16 mJ with a spot size on the sample 14 of approximately 1.8 cm, FWHM (at Full Width Half Maximum points). Adjustment of the delay line are made after each pulse pair (a shot) or groups of shots so as to vary the timing between the heating laser pulse and the electron pulse of the pair(s).

The laser pulse is extracted by a beam splitter 46 between the regenerative amplifier 34 and the double pass amplifier 36. This extraction point is before the delay line. However, the propagation time of the electron pulse in the UHV chamber 28 is much longer than the propagation time of the heating laser pulse. Thus by varying the delay line, the point in time when the heating pulse is incident on the sample 14, before the electron pulse arrives at the sample, is varied (i.e., electrons can probe the surface at a particular time, set by the delay line, before and after the arrival of the laser heat pulse to the surface of the samples).

The laser pulse from the beam splitter 46 is quadrupled in frequency to generate ultraviolet pulses (wavelength 0.266 microns). Two electro optic crystal doublers may be used in series for this purpose. These ultraviolet laser pulses pump the photocathode of the electron gun 12. The photocathode may be a 25 Angstrom gold film deposited on a sapphire window. The photocathode may be held at negative high voltage. The electrons from the photocathode are extracted through a pinhole and focused by a focus cone, which is also maintained at negative high voltage. The electrons accelerate through a grounded anode and are applied through crossed deflection plates between which an anti-astigmatism plate is located. By varying the voltage on these deflection plates, the electron pulses may be focused at the center of the heating pulse on the sample 14. In an exemplary system, the electrons are focused to a spot size of approximately 340 microns, and the electron pulse width was approximately 300 picoseconds. About $10^5$ electrons may be contained in each pulse. Thus, a 1.06 micron laser heating pulse incident to the surface of the sample 14 near normal incidence is applied followed by the electron pulse. Adjustments of the delay line 40 changed the interval between the heating and electron pulse pairs or groups of pulse pairs.

Alternate electron pulses occur without preceding heating pulses, as noted above. Thus, each FIG. 2 display shows the electron diffraction signal without laser heating and then with laser heating. The heated surface causes the intensity of the diffraction spots to decrease. A number of scans may be produced with different spacing between the heating and electron pulse pairs.

FIG. 2 a-h illustrate the diffraction pattern signals from pulses with and without heating. The signals with heating are of lower intensity. The times from an initial time $t_o$ are illustrated in the eight frames of the figure. The spacial position (diffraction streaks) is indicated by the numbers 20, 10, 00, $\overline{10}$, $\overline{2}$-0. This is the image from the rear of the microchannel plate/phosphor screen 16. The 20 positions are not shown in FIG. 1 to simplify the illustration.

The difference between the intensity of the signal with and without laser heating provides information as to the surface temperature at points spaced in time with picosecond resolution. Thus, surface temperature measurements are made by the system with picosecond time resolution.

In order to obtain the thermal characteristic of the surface lattice as shown in FIG. 3, calibration data may be obtained on a CW (static) basis. The sample 14 may be located in the chamber 28 on a resistively heated stage. The intensity of the diffraction pattern as a function of temperature measured by a thermocouple located on the surface of the stage just below the sample. The calibration information obtained is shown in the curve of FIG. 4 as to the change in diffraction peak intensity (considering the peaks of the intensity pattern (e.g., peaks 20 in FIG. 2), or with a polyonomial fit of temperature rise versus percentage change in diffraction streak intensity over the entire signal) may be used. This information may be compared in a comparator of a computer 50 which also receives the signal from the OMA 22. By comparison of the intensity measurements at different time delays, with the static calibration data, the temperature characteristic, shown in FIG. 3, of the surface lattice is obtained (i.e., on a display unit, such as a terminal or printer 53). It will be observed that this temperature characteristic shows the temperature evolution with picosecond resolution of the surface lattice of the sample.

The thermal conductivity K of the surface ($z=0$) for a known value of heat capacity C, can be obtained by programming the computer 50 to find the solution to the following equation which represents the closest fit to FIG. 3 (the temperature characteristic, i.e., the change in temperature with time).

$$C[dT(z,t)/dt] = K[d^2T(z,t)/dz^2] + I(1-R)\alpha\exp{-\alpha z}f(t),$$

where C is the heat capacity per unit volume, (T(z,t) is the temperature profile at distance z normal to the sample surface, t is time, K is the thermal conductivity, I is the laser peak intensity, $\alpha$ is the absorption per unit length, and f(t) is the time dependence of the laser pulse, which is assumed Gaussian.

From the foregoing description, it will be apparent that there has been provided an improved system for surface (first few monolayers) temperature measurements which is not limited by the nature of the material of the surface and which can provide measurements with picosecond time resolution; in other words, a picosecond time resolved surface temperature probe system. Variations and modifications of the herein described system, within the scope of the invention, will undoubtedly suggest themselves to those skilled in the art. Accordingly, the foregoing description should be taken as illustrative and not in a limiting sense.

I claim:

1. A system for measuring the thermal characteristic of the surface lattice of solid state material which comprises means for generating successive pairs or groups of pairs of electron pulses and laser pulses which are synchronous with each other and are separated by successively greater periods of time, which pulses are incident on said surface of said material, means for detecting diffraction patterns produced by said electron pulses upon reflection from said surface, and means responsive to said patterns for obtaining said thermal characteristic.

2. The system according to claim 1 further comprising means for maintaining said material and said detecting means under ultra high vacuum.

3. The system according to claim 1 wherein said pulses are of picosecond range durations.

4. The system according to claim 3 wherein said successively greater periods of times differ by periods in the order of 100's to 1,000's of picoseconds.

5. The system according to claim 4 wherein said generating means includes means for generating laser pulses, and means responsive to said laser pulses for generating said electron pulses.

6. The system according to claim 5 wherein means are provided for focusing said laser pulses and said electron pulses so that said electron pulses are incident at an angle of about 1 to 3 degrees to the surface of said sample and said laser pulses illuminate said surface.

7. The system according to claim 6 wherein said focusing means projects said laser pulses on said surface at approximately normal incidence.

8. The system according to claim 5 wherein said detecting means comprises a screen on which said electrons of said pulses diffracted upon reflection from said surface are incident.

9. The system according to claim 7 wherein said screen is photo-emissive and has a planar structure.

10. The system according to claim 1 wherein said responsive means comprises means for obtaining signals representing the intensity of said pattern as a function of distance along a line across each of said patterns.

11. The system according to claim 10 wherein said responsive means further comprises means for translating said signals into measurements of temperature change with respect to time.

12. The system according to claim 1 wherein said laser pulses are from 150 to 300 picoseconds and said electron pulses are from 100 to 300 picoseconds.

13. The system according to claim 11 further comprising means responsive to said temperature change with time measurements for determining the thermal conductivity of said surface.

* * * * *